(12) United States Patent
Stowe et al.

(10) Patent No.: US 9,429,662 B2
(45) Date of Patent: Aug. 30, 2016

(54) BULK SEMICONDUCTING SCINTILLATOR DEVICE FOR RADIATION DETECTION

(71) Applicants: Ashley C. Stowe, Knoxville, TN (US); Arnold Burger, Nashville, TN (US); Michael Groza, Hendersonville, TN (US)

(72) Inventors: Ashley C. Stowe, Knoxville, TN (US); Arnold Burger, Nashville, TN (US); Michael Groza, Hendersonville, TN (US)

(73) Assignees: Consolidated Nuclear Security, LLC, Oak Ridge, TN (US); Fisk University, Nashville, TN (US)

( * ) Notice: Subject to any disclaimer, the term of this patent is extended or adjusted under 35 U.S.C. 154(b) by 317 days.

(21) Appl. No.: 14/230,822

(22) Filed: Mar. 31, 2014

(65) Prior Publication Data
US 2014/0209805 A1    Jul. 31, 2014

Related U.S. Application Data

(63) Continuation-in-part of application No. 13/658,591, filed on Oct. 23, 2012, now Pat. No. 9,334,581.

(51) Int. Cl.
*G01T 1/20* (2006.01)
*G01T 1/202* (2006.01)
(Continued)

(52) U.S. Cl.
CPC ............. *G01T 1/2023* (2013.01); *C30B 29/46* (2013.01); *G01T 3/08* (2013.01)

(58) Field of Classification Search
CPC ............. G01T 1/16; G01T 1/20; G01T 1/24; G01T 1/202

USPC .............................................. 250/362, 361 R
See application file for complete search history.

(56) References Cited

U.S. PATENT DOCUMENTS

| 4,534,822 A | * | 8/1985 | Sashital | .................. | C30B 19/02 |
| | | | | | 117/60 |
| 7,687,780 B2 | | 3/2010 | Bell et al. | | |
| 2007/0080301 A1 | * | 4/2007 | Bell | .......................... | G01T 1/24 |
| | | | | | 250/370.12 |

OTHER PUBLICATIONS

Wiggins et al. "Investigations of 6LIIn1-xGaxSe2 Semi-Insulating Crystals for Neutron Detection", Proc of SPIE vol. 9593 Hard X-Ray,Gamma Ray and Neutron Detector Physics edited by Franks et al., p. 95930, published Aug. 26, 2015.*

(Continued)

*Primary Examiner* — Yara B Green
*Assistant Examiner* — Meenakshi Sahu
(74) *Attorney, Agent, or Firm* — Clements Bernard PLLC; Christopher L. Bernard; Lawrence A. Baratta, Jr.

(57) ABSTRACT

A bulk semiconducting scintillator device, including: a Li-containing semiconductor compound of general composition Li-III-VI$_2$, wherein III is a Group III element and VI is a Group VI element; wherein the Li-containing semiconductor compound is used in one or more of a first mode and a second mode, wherein: in the first mode, the Li-containing semiconductor compound is coupled to an electrical circuit under bias operable for measuring electron-hole pairs in the Li-containing semiconductor compound in the presence of neutrons and the Li-containing semiconductor compound is also coupled to current detection electronics operable for detecting a corresponding current in the Li-containing semiconductor compound; and, in the second mode, the Li-containing semiconductor compound is coupled to a photodetector operable for detecting photons generated in the Li-containing semiconductor compound in the presence of the neutrons.

16 Claims, 5 Drawing Sheets

(51) Int. Cl.
*G01T 3/08* (2006.01)
*C30B 29/46* (2006.01)

(56) References Cited

OTHER PUBLICATIONS

O. Balachninaite, L. Petraviciute, M. Maciulevicius, V. Sirutkaitis, L. Isaenko, S. Lobanov, A. Yelisseyev, J.-J. Zondy; Absorptance and scattering losses measurements of the mid-infrared nonlinear crystals LiInSe2 and LiInS2 in the IR range.; ISSN 1392-2114 ULTRAGARSAS Nr.3(60). 2006.

L. Isaenko, A. Yelisseyev, S. Lobanov, A. Titov, V. Petrov, J.-J. Zondy, P. Krinitsin, A. Merkulov, V. Vedenyapin, J. Smironova; "Growth and properties of LiGaX2 (X—S, Se, Te) single crystals for nonlinear optical applications in the mid-Ir"; Crys. Res. Technol. 38, No. 3-5, 379-387 (2003) / DO1 10.1002/crat.200310047.; 2003 WILEY-VCH Verlag GmbH & Co. KGaA, Wenheim 0232-1300/03/3-504-0379.

L. Isaenko, P. Krinitsin, V. Vedenyapin, A. Yelisseyev, A. Merkulov, J.-J. Xondy, and V. Petrov; "LiGaTe2: A New Highly Nonlinear Chalcopyrite Optical Crystal for the Mid-IR"; Crystal Growth & Design, vol. 5. No. 4 1325-1329, 2005.

* cited by examiner

BULK SEMICONDUCTING SCINTILLATOR DEVICE FOR RADIATION DETECTION

CROSS-REFERENCE TO RELATED APPLICATION

The present patent application/patent is a continuation-in-part (CIP) of co-pending U.S. patent application Ser. No. 13/658,591, filed on Oct. 23, 2012, and entitled "METHODS FOR SYNTHESIZING SEMICONDUCTOR QUALITY CHALCOPYRITE CRYSTALS FOR NONLINEAR OPTICAL AND RADIATION DETECTION APPLICATIONS AND THE LIKE," the contents of which are incorporated in full by reference herein.

STATEMENT REGARDING FEDERALLY SPONSORED RESEARCH OR DEVELOPMENT

The U.S. Government has rights to the present disclosure pursuant to Contract No. AC05-00OR22800 between the U.S. Department of Energy and Babcock and Wilcox Technical Services Y-12, LLC.

FIELD OF THE DISCLOSURE

The present disclosure relates generally to methods for synthesizing semiconductor quality chalcopyrite crystals for nonlinear optical and radiation detection applications and the like. More specifically, the present disclosure relates to methods for synthesizing a semiconductor detector of ionizing electromagnetic radiation, neutrons, and energetic charged particles. Finally, the present disclosure relates to a bulk semiconducting scintillator device for radiation detection that includes one material and that may be used in two detection modes, detecting both electron-hole pairs created within a bulk crystal (semiconductor detection) and/or photons generated by a $^6$Li(n,$\alpha$) reaction or the like detected using a photomultiplier or the like (scintillator detection).

BACKGROUND OF THE DISCLOSURE

The present state-of-the-art in semiconductor radiation detection is silicon diodes, high purity germanium (cooled by liquid nitrogen), and compound semiconductors, such as cadmium zinc telluride (CZT) and mercuric iodide. Each of these materials has one or more significant drawbacks related to its use. Silicon has a low atomic number and is therefore primarily useful for the detection of energetic charged particles and atomic x-rays emitted by low atomic number elements. Germanium has a higher atomic number but, because of its low band gap energy, must be cooled by liquid nitrogen in a bulky, expensive, and potentially dangerous cryogenic system in order to reduce thermally generated noise. Compound semiconductors, such as CZT and mercuric iodide, have sufficiently high band gap energy to be useful at or near room temperature. However, CZT has been plagued by production problems, resulting in polycrystalline ingots with twins, inclusions, and grain boundary defects. These defects can never be completely removed and are a consequence of CZT being a solid solution, rather than a true compound. The result is that spectroscopy grade crystals must be mined from bulk material. Mercuric iodide suffers from low carrier mobility, short carrier lifetime, space charge polarization, and surface degradation. In addition, mercuric iodide is an extremely soft material that is easily damaged by the slight pressure of an electrical connection and by temperatures over sixty degrees Celsius. In general, these compound semiconductors do not interact with neutrons such that they must be coupled with a thin layer of a neutron absorbing material, such as $^6$LiF or $^{10}$B. A reaction between $^6$Li or $^{10}$B occurs in the thin absorber layer, which creates alpha particles that are detected by a semiconducting substrate. The absorber layer must be thin in order for the semiconducting substrate to detect the resultant alpha particles. $^3$He gas filled tube detectors are the state-of-the-art for thermal neutron detection.

As a result, U.S. Pat. No. 7,687,780 (Bell et al.) provides a semiconductor detector of ionizing electromagnetic radiation, neutrons, and energetic charged particles. The detecting element includes a compound having the composition I-III-VI$_2$ or II-IV-V$_2$, where the "I" component is from column 1A or 1B of the periodic table, the "II" component is from column 2B of the periodic table, the "III" component is from column 3A of the periodic table, the "IV" component is from column 4A of the periodic table, the "V" component is from column 5A of the periodic table, and the "VI" component is from column 6A of the periodic table. The detecting element detects ionizing electromagnetic radiation by generating a signal proportional to the energy deposited in the element, and detects neutrons by virtue of the ionizing electromagnetic radiation emitted by one or more of the constituent materials subsequent to capture. The detector may contain more than one neutron sensitive component.

Related to the I-III-VI$_2$ compounds, however, improved methods for combining the elemental constituents in a multistep synthetic process are still required, providing improved purity and homogeneity and more precisely controlling the reaction rate and yielding a I-III-VI$_2$ charge with a single phase stoichiometry.

Further, significant effort has been devoted to the development of novel materials and methods for the detection of ionizing radiation in recent years with the increased demand for helium-3 worldwide for medical devices, condensed matter physics, radiation detection, and neutron science. A variety of gas tube detectors (including $^3$He and $^{10}$BF$_3$), scintillators (BGO, CLYC, and plastics), and semiconductors ($^6$LiInSe$_2$) have been developed for neutron detection. Many other detection materials have been developed for gamma detection. Thermal neutron detection requires that two criteria be met. First, the detection medium must be highly efficient in the detection of incident thermal neutrons. Second, the detector must achieve high neutron discrimination in a gamma flux. Gamma discrimination of $10^6$ is required for most applications, which is accomplished by using low-Z elements, thin detectors, gamma shielding, and/or pulse shape discrimination algorithms.

Advantageously, the present disclosure provides high neutron efficiency in a thin detection crystal (<5 mm) and has relatively low Z. High intrinsic discrimination is achieved in a semiconducting mode; however, discrimination is enhanced further when operated as a scintillator. The device of the present disclosure is designed to operate discretely as a semiconductor or a scintillator, or in a combination mode where neutron events are correlated between both modes and counted. This further increases gamma discrimination.

In addition, the present scintillation crystal generates photons that better match the photomultiplier used as compared to other scintillator crystals, such that the device can operate as an all solid-state scintillator for neutron detection.

BRIEF SUMMARY OF THE DISCLOSURE

In various exemplary embodiments, the present disclosure provides a multistep synthetic process for synthesizing an inorganic compound with unique electrical and optical properties. This compound is semiconducting and can be developed for nonlinear optical applications, as well as radiation detection. The I-III-VI$_2$ stoichiometry crystallizes into a chalcopyrite type structure, and when the Group I element is lithium, the material is potentially ideal for the room temperature detection of neutrons, for example. The best known synthesis method, described in U.S. Pat. No. 7,687,780 (Bell et al.), involves heating stoichiometric quantities of the three elemental powders simultaneously to form the I-III-VI$_2$ compound. For the lithium containing compounds, lithium reactivity is difficult to control, leading to poor phase homogeneity. Thus, the present disclosure provides improved methods for combining the elemental constituents in a multistep synthetic process. These methods provide improved purity and homogeneity and more precisely control the reaction rate, thereby yielding a I-III-VI$_2$ charge with a single phase stoichiometry.

In one exemplary embodiment, the present disclosure provides a method for synthesizing I-III-VI$_2$ compounds, including: melting a Group III element; adding a Group I element to the melted Group III element at a rate that allows the Group I and Group III elements to react thereby providing a single phase I-III compound; and adding a Group VI element to the single phase I-III compound and heating. The Group III element is melted at a temperature of between about 200 degrees C. and about 700 degrees C. One (1) mole of the Group I element is added to 1 mole of the Group III element. The Group I element consists of a neutron absorber, preferably $^6$Li, and the Group III element consists of In or Ga. The Group VI element and the single phase I-III compound are heated to a temperature of between about 700 degrees C. and about 1000 degrees C. Two (2) moles of the Group VI element are added to the single phase I-III compound. Preferably, the Group VI element consists of S, Se, or Te. Optionally, the method also includes doping with a Group IV element activator.

In another exemplary embodiment, the present disclosure provides a method for synthesizing I-III-VI$_2$ compounds, including: melting a Group III element; adding a Group I element to the melted Group III element at a rate that allows the Group I and Group III elements to react thereby providing a single phase I-III compound; and adding a Group VI element to the single phase I-III compound under heat while rotating all constituents at an angle. The Group III element is melted at a temperature of between about 200 degrees C. and about 700 degrees C. One (1) mole of the Group I element is added to 1 mole of the Group III element. The Group I element consists of a neutron absorber, preferably $^6$Li, and the Group III element consists of In or Ga. The Group VI element and the single phase I-III compound are heated to a temperature of between about 700 degrees C. and about 1000 degrees C. Two (2) moles of the Group VI element are added to the single phase I-III compound. Preferably, the Group VI element consists of S, Se, or Te. Optionally, the method also includes doping with a Group IV element activator.

In a further exemplary embodiment, the present disclosure provides a method for synthesizing I-III-VI$_2$ compounds, including: melting a Group III element; adding a Group I element to the melted Group III element at a rate that allows the Group I and Group III elements to react thereby providing a single phase I-III compound; and adding a Group VI element to the single phase I-III compound under heat via vapor transport. The Group III element is melted at a temperature of between about 200 degrees C. and about 700 degrees C. One (1) mole of the Group I element is added to 1 mole of the Group III element. The Group I element consists of a neutron absorber, preferably $^6$Li, and the Group III element consists of In or Ga. The Group VI element and the single phase I-III compound are heated to a temperature of between about 700 degrees C. and about 1000 degrees C. Two (2) moles of the Group VI element are added to the single phase I-III compound. Preferably, the Group VI element consists of S, Se, or Te. Optionally, the method also includes doping with a Group IV element activator. In this exemplary embodiment, the single phase I-III compound and the Group VI element are physically separated in the reaction vessel prior to the reaction. The reaction takes place through vapor transport of the Group VI element into the single phase I-III compound melt by maintaining the Group VI element region at a higher temperature than the single phase I-III compound melt region.

In various exemplary embodiments, the present disclosure also provides a semiconducting crystal, which has been shown to respond to ionizing radiation (alpha, gamma, and thermal neutrons), that exhibits scintillation properties in a radiation flux. The crystal can be configured to operate with an electrical bias to detect electron-hole pairs (said electron-hole pairs resulting in a current) created within the bulk crystal (semiconductor detection mode) and/or photons generated by a $^6$Li(n,α) reaction or the like detected using a photomultiplier or the like (scintillator detection mode). The class of Li-containing semiconductor compounds of general composition $^6$Li-III-VI$_2$, where III is a Group III element, such as Ga or In, and VI is a Group VI element, such as S, Se, or Te, can be used as the semiconducting scintillation medium. The $^6$Li-III-VI$_2$ crystal represents the first material that acts both as a semiconductor neutron detector and as an un-doped scintillator. In scintillation mode, it also represents the first all solid-state scintillator detector (when combined with a Si photomultiplier (SiPM) collector).

Thus, in a still further exemplary embodiment, the present disclosure provides a bulk semiconducting scintillator device, including: a Li-containing semiconductor compound of general composition Li-III-VI$_2$, wherein III is a Group III element and VI is a Group VI element; wherein the Li-containing semiconductor compound is used in one or more of a first mode and a second mode, wherein: in the first mode, the Li-containing semiconductor compound is coupled to an electrical circuit under bias operable for measuring electron-hole pairs in the Li-containing semiconductor compound in the presence of neutrons, and further coupled to current detection electronics operable for detecting a corresponding current in the Li-containing semiconductor compound where the corresponding current is a current that is proportional to the number of neutrons that interact with the Li-containing semiconductor compound; and, in the second mode, the Li-containing semiconductor compound is coupled to a photodetector operable for detecting photons generated in the Li-containing semiconductor compound in the presence of the neutrons. Preferably, the Li-containing semiconductor compound is $^6$LiInSe$_2$. The photons are generated in the Li-containing semiconductor compound in the presence of the neutrons in a $^6$Li(n,α) reaction. The Li-containing semiconductor compound is free of dopants. Optionally, the photodetector is a solid-state Si photomultiplier. Preferably, the generated photons are wavelength matched to the solid-state Si photomultiplier. When the Li-containing semiconductor compound is used in both the first mode and the second mode, a coincident counting algorithm is used to detect the neutrons. The Li-III-VI$_2$ semiconductor compound is formed by the process of: melting the Group III element; adding a Group I element to the melted Group III element at a rate that allows the Group I and Group III elements to react thereby providing a single phase I-III compound; and adding the Group VI element to the single phase I-III compound and heating; wherein the Group I element comprises Li.

Finally, in a still further exemplary embodiment, the present disclosure provides provides a bulk semiconducting scintillator method, including: providing a Li-containing semiconductor compound of general composition Li-III-VI$_2$, wherein III is a Group III element and VI is a Group VI element; wherein the Li-containing semiconductor compound is used in one or more of a first mode and a second mode, wherein: in the first mode, the Li-containing semiconductor compound is coupled to an electrical circuit under bias operable for measuring electron-hole pairs in the Li-containing semiconductor compound in the presence of neutrons, and further coupled to current detection electronics operable for detecting a corresponding current in the Li-containing semiconductor compound where the corresponding current is a current that is proportional to the number of neutrons that interact with the Li-containing semiconductor compound; and, in the second mode, the Li-containing semiconductor compound is coupled to a photodetector operable for detecting photons generated in the Li-containing semiconductor compound in the presence of the neutrons. Preferably, the Li-containing semiconductor compound is $^6$LiInSe$_2$. The photons are generated in the Li-containing semiconductor compound in the presence of the neutrons in a $^6$Li(n,α) reaction. The Li-containing semiconductor compound is free of dopants. Optionally, the photodetector is a solid-state Si photomultiplier. Preferably, the generated photons are wavelength matched to the solid-state Si photomultiplier. When the Li-containing semiconductor compound is used in both the first mode and the second mode, a coincident counting algorithm is used to detect the neutrons. The Li-III-VI$_2$ semiconductor compound is formed by the process of: melting the Group III element; adding a Group I element to the melted Group III element at a rate that allows the Group I and Group III elements to react thereby providing a single phase I-III compound; and adding the Group VI element to the single phase I-III compound and heating; wherein the Group I element comprises Li.

BRIEF DESCRIPTION OF THE DRAWINGS

The present disclosure is illustrated and described herein with reference to the various drawings, in which like reference numbers are used to denote like method steps/device components, as appropriate, and in which.

DETAILED DESCRIPTION OF THE DISCLOSURE

Figure 1:
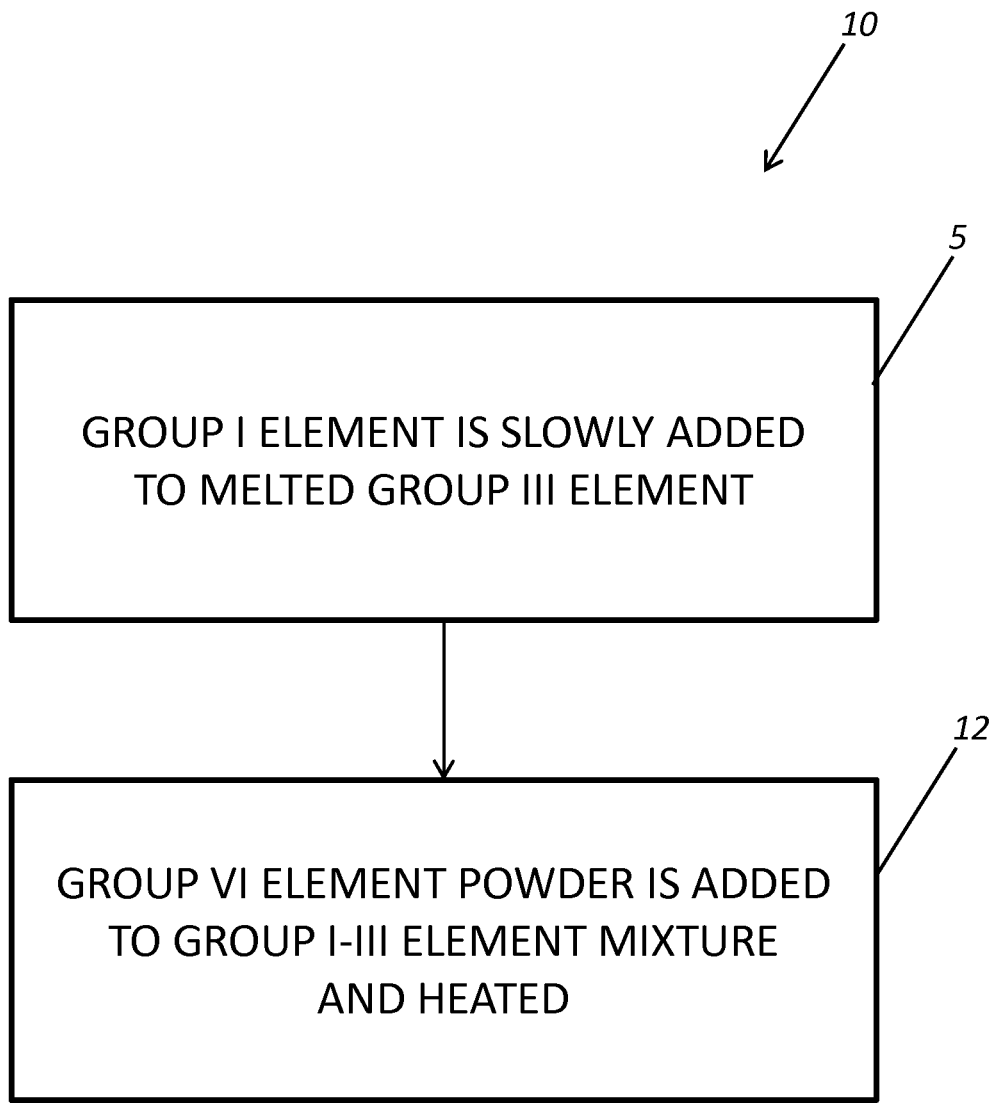
FIG. 1 is a flowchart illustrating one exemplary embodiment of the method for synthesizing I-III-VI$_2$ compounds of the present disclosure, specifically utilizing a heating process.

Again, related to U.S. Pat. No. 7,687,780 (Bell et al.), the detecting element includes a compound having the composition I-III-VI$_2$ or II-IV-V$_2$, where the "I" component is from column 1A or 1B of the periodic table, the "II" component is from column 2B of the periodic table, the "III" component is from column 3A of the periodic table, the "IV" component is from column 4A of the periodic table, the "V" component is from column 5A of the periodic table, and the "VI" component is from column 6A of the periodic table. A more concise manner of description is that the crystal is formed from elements in the group of 1A-3A-6A, 1B-3A-6A, or 2B-4A-5A of the periodic table. An example from group 1A-3A-6A is lithium-gallium-selenium. An example from group 1B-3A-6A is copper-gallium-selenium. An example from group 2B-4A-5A is cadmium-germanium-antimony. Crystals formed from groups 1B-3A-6A and 2B-4A-5A are chalcopyrites. The detecting element detects ionizing electromagnetic radiation by generating a signal proportional to the energy deposited in the element, and detects neutrons by virtue of the ionizing electromagnetic radiation emitted by one or more constituent materials subsequent to capture. The detector may contain more than one neutron sensitive element.

The detecting system generally includes a semiconductor crystal onto which conducting electrodes are deposited on opposing surfaces of the crystal. The semiconductor material may be intrinsic material or doped to produce intrinsic material. Intrinsic material, when referring to semiconductors, refers to a semiconductor material in which the majority and minority charge carriers in the material are balanced and the material does not display either negative (n–) or positive (p–) type conductivity. Doping is the process of introducing small amounts of impurities (typically in the amount of parts per million (ppm)) for the purpose of altering the electrical properties of the material to force a desired density of positive and negative charge carriers. The electrical contacts may be ohmic, or may be Schottky. An ohmic contact is a metal semiconductor contact with very low resistance independent of the polarity of the applied voltage. A Schottky contact is a metal semiconductor contact used to form a potential barrier. The resulting detecting element forms a p-n, or p-i-n diode, or simply a bulk semiconducting material.

In a preferred embodiment, a voltage is applied between the electrodes by a suitable means, such as a battery. A resistor is provided in line between one of the electrodes and the battery. Any signal generated in response to radiation is extracted through a junction between the crystal and the resistor. If the detecting element is simply bulk semiconducting material, then the polarity of the voltage with respect to the resistor is of no consequence. Although the resistor connected between the negative terminal of the battery and the crystal is contemplated, the resistor may also be connected between the positive terminal of the battery and the crystal with the signal taken from the junction between the resistor and the crystal. If the crystal is realized as a diode (p-n, p-i-n, or Schottky), then the connection must be such that the diode is reverse biased by the battery.

When the crystal is exposed to ionizing electromagnetic radiation, electron-hole pairs are created in the bulk of the material. These charges are separated by the applied voltage (i.e., the electrical bias) and the resulting charge pulse is sensed as a current pulse or a voltage pulse. The amplitude of the charge pulse is proportional to the energy deposited in the crystal by the radiation. In this mode, the crystal realizes a detector of alpha, beta, gamma, and x-ray radiation, in addition to cosmic rays.

In one arrangement, the crystal may be fabricated with one element that reacts with neutrons and subsequently emits ionizing electromagnetic radiation. The crystal then also serves to detect neutrons. For example, if the "I" element is silver (Ag), an element from column 1B of the periodic table, then exposure to neutrons results in transmutation of the silver nuclei to radioisotopes with short half-lives. These isotopes decay by the emission of beta particles (electrons), which create ionization in the detector just as would radiation originating outside the detecting element. Analysis of the spectrum of pulse amplitudes and the temporal behavior of the count rate yields a signature of the presence of neutrons.

In another arrangement, if the "I" element is lithium, an element from column 1A of the periodic table, then exposure to neutrons results in the exothermic reaction $^6Li(n,\alpha)^3H$. The energetic triton and alpha particles liberate charge as they decelerate, ultimately depositing their entire energy in the crystal. Analysis of the resulting spectrum of pulse amplitudes yields a signature of the presence of neutrons.

In a further arrangement, if the "III" (3A) element of the crystal is indium (In), behavior similar to that described for silver is observed. In a still further arrangement, more than one element may be neutron sensitive. For example, if both silver and indium are used, then multiple half-lives are observed in the count rate, and spectra of beta particles characteristic of both elements are observed in the pulse height spectrum. Analysis of such data can give information on the spectral characteristics of the incident neutron flux.

In operation, the semiconductor radiation detecting apparatus works in the following manner. Means are provided to convert current or charge pulses to a digital value. The electrical charge signal generated in response to radiation passes from the junction through a capacitor to a charge integrating pre-amplifier whose output signal, in turn, is directed to a shaping amplifier. The shaping amplifier produces an approximately Gaussian shaped pulse. The pulse is directed to an analog-to-digital converter (ADC), which translates the analog voltage developed by the shaping amplifier into a digital value. The digital values from the converter are directed to a processor and display. The processor records the number of times each value occurs during a measurement. This accumulates a histogram of the magnitudes of the pulses produced by the incident radiation. The processor compares these values to known values and provides an indication of the incident radiation based on the comparison. The use of the amplifiers, converter, and processor to condition signals and create an indication of the incident radiation is well known to those of ordinary skill in the art and does not require detailed explanation.

In an alternate embodiment, the pre-amplifier simply provides gain without integration and the shaping amplifier is replaced by a voltage comparator and gated integrator. The voltage comparator triggers the gated integrator to integrate the voltage pulse from the pre-amplifier. The gated integrator signals the ADC to perform a conversion when the integration period is complete. The processor and display perform the same functions as described above.

In another alternate embodiment, a battery supplies bias to the crystal. The charge generated by incident radiation in the crystal is separated by the potential developed by the virtual ground at the inverting terminal of the operational amplifier, and the resulting current pulse is forced through a feedback resistor. In this manner, the current pulse is converted to a voltage pulse and is then directed to the pre-amplifier.

These crystals are useful as radiation detectors, and as semiconductors, for the following reasons. Carrier mobility in the range of 500-10,000 $cm^2/V$-s has been reported and band gaps between 1.2 and 2.7 eV have been produced. These values are comparable to or better than those of germanium and indicate that performance at room temperature should exceed that of CZT. In addition, some of the constituent materials have high neutron absorption cross sections, conferring simultaneous sensitivity to ionizing electromagnetic radiation and neutrons.

There are a number of advantages to using chalcopyrites. There is a ready availability of high purity, oriented, crack free, single chalcopyrite crystals produced for use in optical applications. These crystals are used in infrared nonlinear optical equipment to effect second harmonic generation or optical parametric oscillation. The finished materials have improved properties that should continue to improve as a result of research and development spurred by the interest of the military in using chalcopyrites in high powered lasers. Chalcopyrites have physical properties that permit their use as semiconductor radiation detectors at room temperature. As such, they operate according to the same physics as do silicon, CZT, and mercuric iodide. However, they differ from these materials in that the average atomic number is much larger than silicon, making them useful at higher energies than silicon. They can be grown in large, crack free single crystal boules (unlike CZT and mercuric iodide). They also are an improvement over mercuric iodide in that the use of mercuric iodide is limited to applications in which the temperature does not exceed 80 degrees Celsius, while chalcopyrites can withstand temperatures up to several hundred degrees Celsius.

Without limitation, it may be advantageous to deposit more than two electrodes onto the crystal to control the shape of the internal electric field. In another example, sandwiching the crystal between spring loaded contacts enables the application of a voltage without the deposition of electrodes. In yet another example, the pre-amplifier, shaping amplifier, and ADC may be replaced by a charge-to-digital converter.

Figure 2:
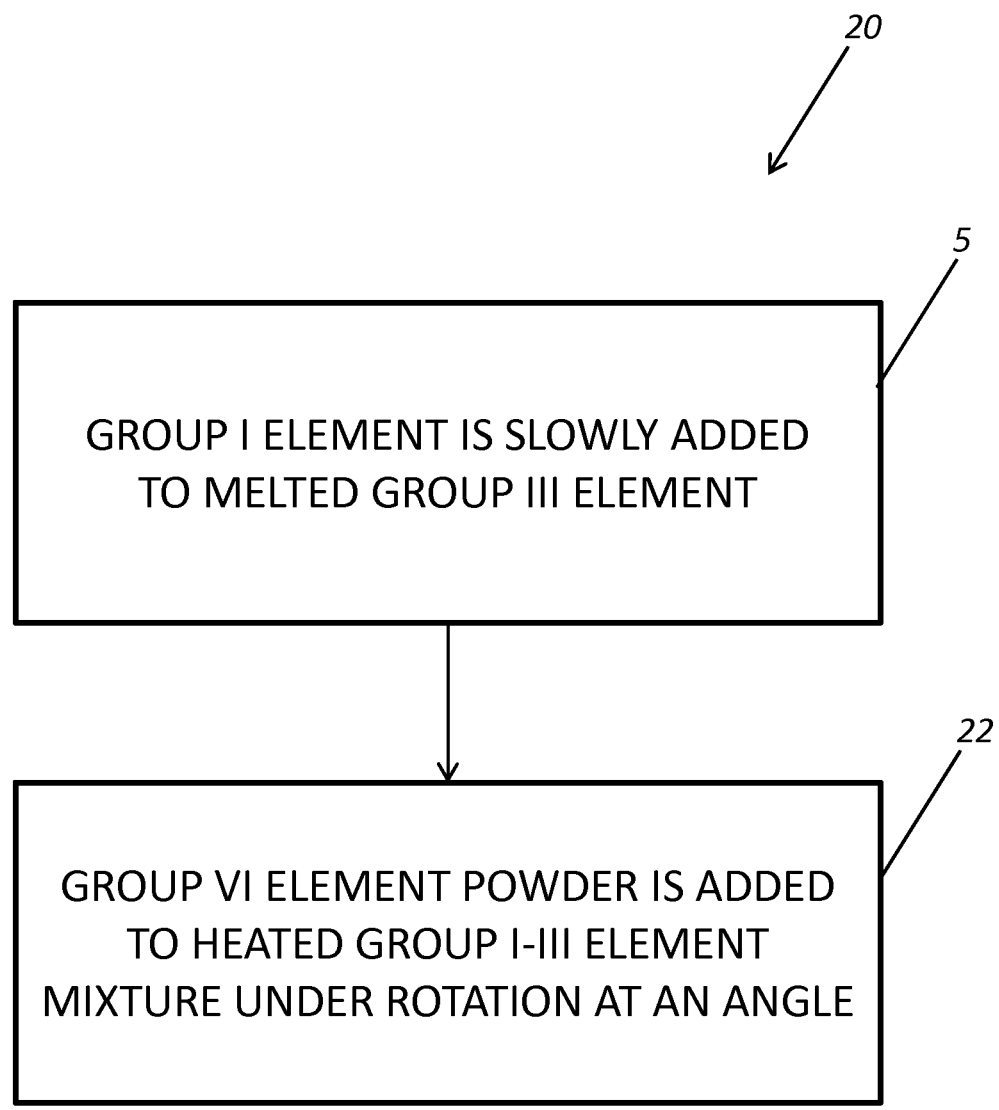
FIG. 2 is a flowchart illustrating another exemplary embodiment of the method for synthesizing I-III-VI$_2$ compounds of the present disclosure, specifically utilizing a mixing process.
Figure 3:
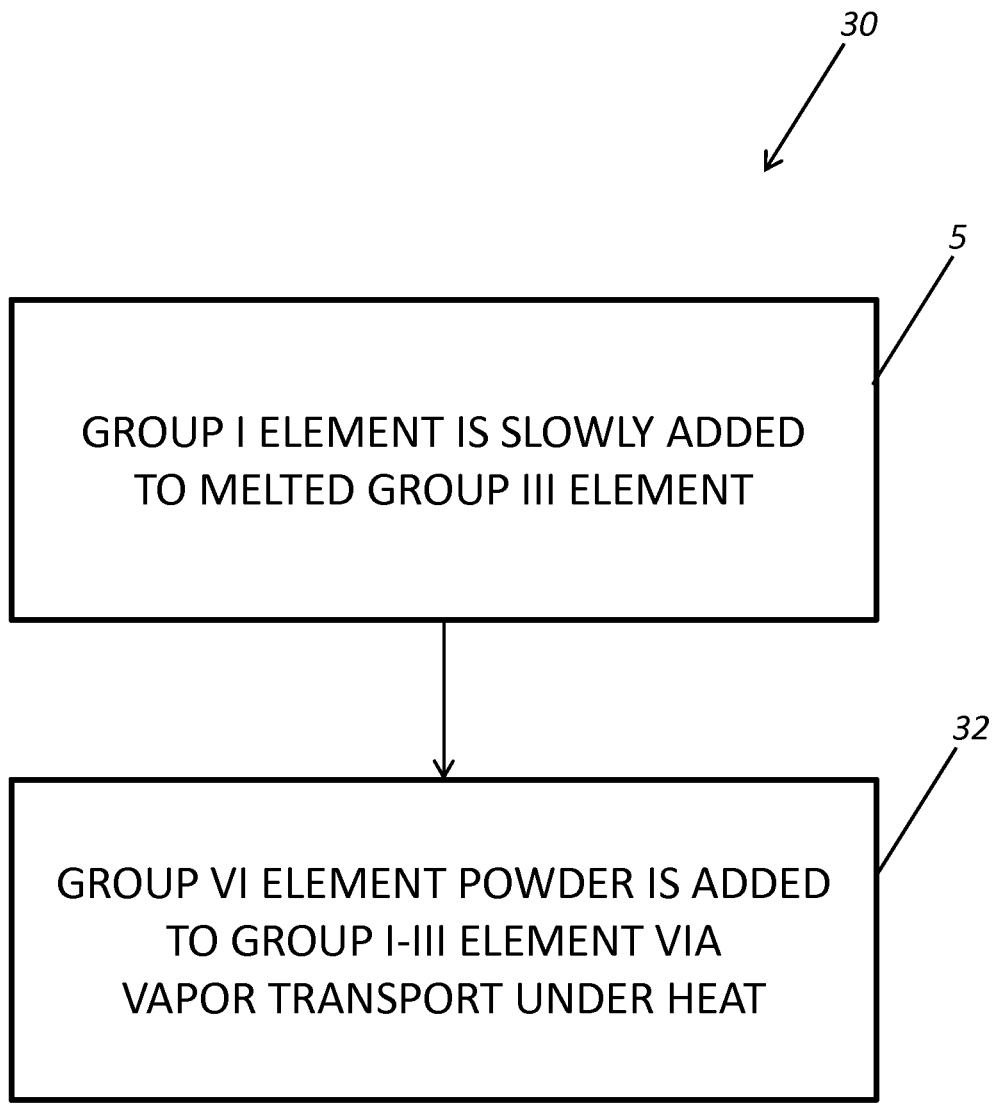
FIG. 3 is a flowchart illustrating a further exemplary embodiment of the method for synthesizing I-III-VI$_2$ compounds of the present disclosure, specifically utilizing a vapor transport process.

In view of the above, the present disclosure involves separating I-III-$VI_2$ synthesis from the constituent elements into two distinct steps, and three associated embodiments are contemplated. The highest quality elemental starting materials are required to achieve successful synthesis of I-III-$VI_2$ compounds. Group I elements typically have the lowest purities as starting materials. Referring to FIGS. 1-3, in all exemplary embodiments, the most reactive element (Group I) is reacted with the Group III element, forming a binary alloy with equal stoichiometry (step 5). The Group III element is melted in a crucible under inert atmosphere for increased purity and safety. The Group I element is then slowly added to the melt, allowing the small amount of Group I element to react before another addition. This process minimizes overheating of the reaction, which causes additional alloy stoichiometries to form in the melt. The result is a highly crystalline, single phase I-III material. Two moles of a Group VI element are then added to the I-III compound at elevated temperature to form the chalcopyrite I-III-$VI_2$. The method by which the Group VI element is added is different in each of the three exemplary embodiments.

Referring specifically to FIG. 1, in the first exemplary embodiment 10, the Group VI elemental powder is added directly to the I-III alloy and heated to 700-900 degrees C. (depending on the group VI element) in a crucible (step 12). The reaction is allowed to proceed to completion and then cooled. Because the I-III compound is formed in an initial reaction step, the stoichiometry is defined as one mole for each element. Addition of the Group VI element for the final I-III-VI reaction has lower overall stoichiometric variability throughout the charge.

Referring specifically to FIG. 2, in the second exemplary embodiment 20, the addition of the Group VI element into a single crucible is as with the first exemplary embodiment; however, the constituents are mixed at elevated temperature with constant crucible rotation at an angle (step 22), for example about 20 degrees. Rotation further promotes mixing during the synthesis to reduce phase variability.

Referring specifically to FIG. 3, the third exemplary embodiment 30 involves vapor transport of the Group VI element (step 32). The previously prepared I-III compound is placed in one well of a crucible, while the Group VI element is placed in an adjacent well. As the mixture is heated to 700-900 degrees C., the Group VI element slowly vaporizes and is transported through thermal currents to the melted group I-III well. The reaction then occurs to form I-III-VI$_2$. Vapor transport further slows the reaction to minimize overheating and promote a single phase synthetic charge.

It should be noted that the methods of the present invention are not limited to the synthesis of semiconductor materials. Doping with an activator (e.g., Group IV element) may be performed to create a scintillator material, for example.

Figure 4:
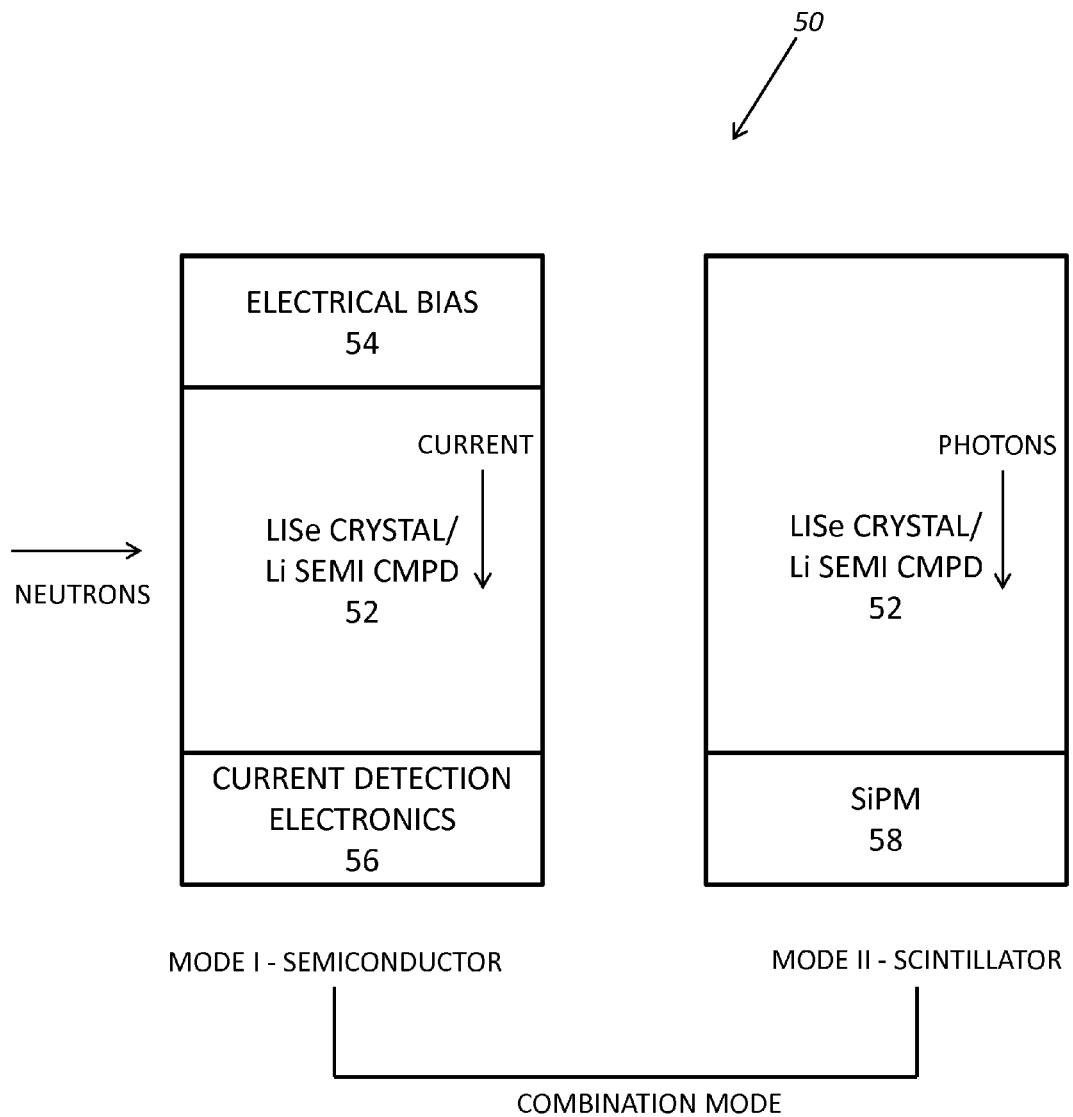
FIG. 4 is a schematic diagram illustrating one exemplary embodiment of the bulk semiconducting scintillator device of the present disclosure.

Referring now specifically to FIG. 4, the class of Li-containing semiconductor compounds of general composition Li-III-VI$_2$, where III is a Group III element, such as Ga or In, and VI is a Group VI element, such as S, Se, or Te, has been shown to respond to neutrons. Thus far, $^6$LiInSe$_2$ has proven to provide the best neutron response for thermal neutrons. Such crystals have been applied to simple neutron counting applications, where a single crystal is electrically biased such that a neutron generates enough charged particles within the crystal to create detectable current. The incoming neutron reacts with $^6$Li in the crystal creating charged particles that are translated into electron-hole pairs within the semiconductor. These electron-hole pairs create current through the circuit under bias proportional to the number of neutron reactions. This represents the first (semiconductor) mode of operation of the device 50 of the present disclosure. The crystal 52 is coupled to an electrical bias 54 and current detection electronics 56 by conductive electrical contacts (not illustrated), such as gold or silver contacts, that are deposited on either side of the crystal. The electrical bias 54 is applied to provide a driving force for electron-hole pairs (not illustrated) created by the ionizing radiation. The electrical signal is transmitted through a preamplification module to a multichannel analyzer to collect the signal.

Figure 5:
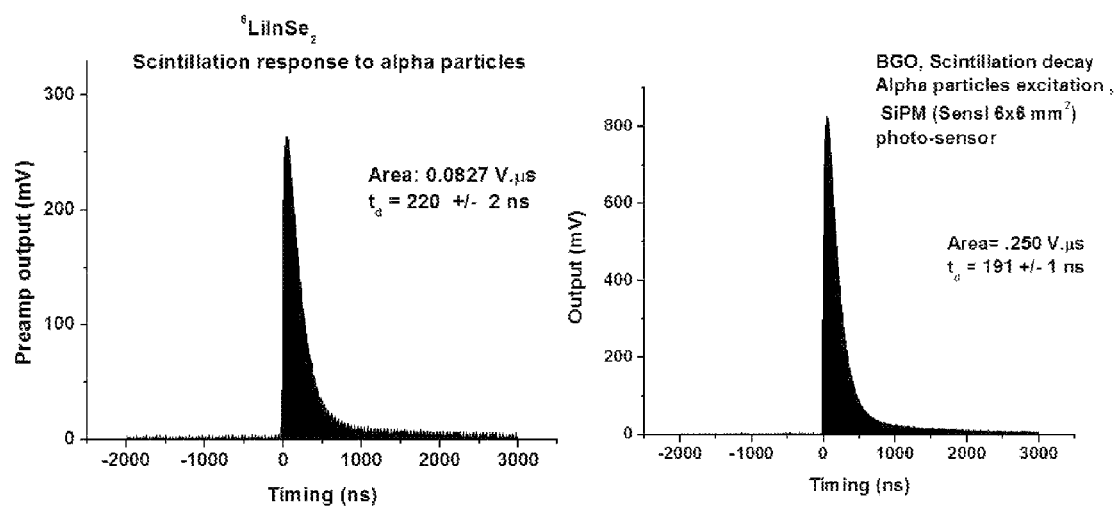
FIG. 5 is a series of plots illustrating the scintillation response of both $^6$LiInSe$_2$ and BGO to alpha particles.

In the second (scintillator) mode of operation of the device 50 of the present disclosure, the crystal 52 of FIG. 4 can also act as a scintillator without the addition of dopants, whereas dopants are typically required in traditional scintillators. The crystal 52 includes the neutron active element ($^6$Li) and produces photons in the $^6$Li(n,α) reaction, as with the electron-hole pairs present in the semiconductor detection mode. These scintillation photons provide a second mode of operation and are detected by combining the crystal 52 with a light collection device 58, such as a photomultiplier tube (PMT) or a solid-state Si photomultiplier (SiPM). The light output of the $^6$Li-III-VI$_2$ crystal is similar to that of a typical commercial scintillator, such as BGO (see FIG. 5 for a comparison); however, the photon wavelength is better matched with the SiPM 58. The combination of a $^6$Li-III-VI$_2$ crystal 52 with a SiPM 58 results in an all solid-state scintillation detector that offers reduced cost, size, and power requirements, while maintaining high brightness and precise neutron-gamma discrimination. Further, when the device 50 is configured to operate in both semiconductor and scintillator modes, coincident counting can be used to further improve discrimination because neutrons and gammas interact with the crystal 52 differently between the two modes of operation.

Again, there are a few semiconductor and scintillator technologies being developed as alternatives to helium-3 or $^{10}$BF$_3$ gas tubes for thermal neutron detection. However, prior to the crystal of the present disclosure, no crystal existed that can operate as both a semiconductor radiation detector and as a scintillation radiation detector without the presence of a dopant. ZnO and CdS doped with either In or Ga have been considered as gamma detection crystals, for example; however, these crystal systems were never pursued due to their low Z. More recently, heavily doped GaAs and InP has been pursued in an effort to observe scintillation from incident radiation by shifting the absorption band edge. This scheme has been combined with a PMT, rather than a SiPM, and is limited to high energy radiation.

The $^6$Li-III-VI$_2$ crystal is the first material that detects ionizing radiation by acting both as a semiconductor (i.e. the $^6$Li(n,α) reaction creates electron-hole pairs) and as a scintillator (i.e. the $^6$Li(n,α) reaction creates photons). In scintillation mode, it is also the first all solid-state scintillator when a SiPM light collector is employed.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A bulk semiconducting scintillator device, comprising:
a Li-containing semiconductor compound of general composition Li-III-VI$_2$, wherein III is a Group III element and VI is a Group VI element;
wherein the Li-containing semiconductor compound is simultaneously configured to be selectively used in one or more of a first mode and a second mode, wherein:
in the first mode, the Li-containing semiconductor compound is coupled to an electrical circuit under bias operable for measuring electron-hole pairs in the Li-containing semiconductor compound in the presence of neutrons and the Li-containing semiconductor compound is also coupled to current detection electronics operable for detecting a corresponding current in the Li-containing semiconductor compound; and
in the second mode, the Li-containing semiconductor compound is coupled to a photodetector operable for detecting photons generated in the Li-containing semiconductor compound in the presence of the neutrons.

2. The device of claim 1, wherein the Li-containing semiconductor compound comprises $^6$LiInSe$_2$.

3. The device of claim 1, wherein the photons are generated in the Li-containing semiconductor compound in the presence of the neutrons in a $^6$Li(n,α) reaction.

4. The device of claim 1, wherein the Li-containing semiconductor compound is free of dopants.

5. The device of claim 1, wherein the photodetector comprises a solid-state Si photomultiplier.

6. The device of claim 5, wherein the generated photons are wavelength matched to the solid-state Si photomultiplier.

7. The device of claim 1, wherein, when the Li-containing semiconductor compound is used in both the first mode and the second mode, a coincident counting algorithm is used to detect the neutrons.

8. The device of claim 1, wherein the Li-III-VI$_2$ semiconductor compound is formed by the process of:
   melting the Group III element;
   adding a Group I element to the melted Group III element at a rate that allows the Group I and Group III elements to react thereby providing a single phase I-III compound; and
   adding the Group VI element to the single phase I-III compound at elevated temperature;
   wherein the Group I element comprises Li.

9. A bulk semiconducting scintillator method, comprising:
   providing a Li-containing semiconductor compound of general composition Li-III-VI$_2$, wherein III is a Group III element and VI is a Group VI element;
   wherein the Li-containing semiconductor compound is simultaneously configured to be selectively used in one or more of a first mode and a second mode, wherein:
      in the first mode, the Li-containing semiconductor compound is coupled to an electrical circuit under bias operable for measuring electron-hole pairs in the Li-containing semiconductor compound in the presence of neutrons and the Li-containing semiconductor compound is also coupled to current detection electronics operable for detecting a corresponding current in the Li-containing semiconductor compound; and
      in the second mode, the Li-containing semiconductor compound is coupled to a photodetector operable for detecting photons generated in the Li-containing semiconductor compound in the presence of the neutrons.

10. The method of claim 9, wherein the Li-containing semiconductor compound comprises $^6$LiInSe$_2$.

11. The method of claim 9, wherein the photons are generated in the Li-containing semiconductor compound in the presence of the neutrons in a $^6$Li(n,α) reaction.

12. The method of claim 9, wherein the Li-containing semiconductor compound is free of dopants.

13. The method of claim 9, wherein the photodetector comprises a solid-state Si photomultiplier.

14. The method of claim 9, wherein the generated photons are wavelength matched to the solid-state Si photomultiplier.

15. The method of claim 9, wherein, when the Li-containing semiconductor compound is used in both the first mode and the second mode, a coincident counting algorithm is used to detect the neutrons.

16. The method of claim 9, wherein the Li-III-VI$_2$ semiconductor compound is formed by the process of:
   melting the Group III element;
   adding a Group I element to the melted Group III element at a rate that allows the Group I and Group III elements to react thereby providing a single phase I-III compound; and
   adding the Group VI element to the single phase I-III compound at elevated temperature;
   wherein the Group I element comprises Li.

* * * * *